(12) United States Patent
Guenard et al.

(10) Patent No.: US 8,785,293 B2
(45) Date of Patent: Jul. 22, 2014

(54) ADAPTATION OF THE LATTICE PARAMETER OF A LAYER OF STRAINED MATERIAL

(75) Inventors: Pascal Guenard, Froges (FR); Frederic Dupont, Seyssins (FR)

(73) Assignee: SOITEC, Bernin (FR)

(*) Notice: Subject to any disclaimer, the term of this patent is extended or adjusted under 35 U.S.C. 154(b) by 155 days.

(21) Appl. No.: 13/147,749

(22) PCT Filed: Feb. 15, 2010

(86) PCT No.: PCT/IB2010/000296
§ 371 (c)(1),
(2), (4) Date: Aug. 3, 2011

(87) PCT Pub. No.: WO2010/103356
PCT Pub. Date: Sep. 16, 2010

(65) Prior Publication Data
US 2011/0294245 A1    Dec. 1, 2011

(30) Foreign Application Priority Data
Mar. 12, 2009 (FR) ........................... 09 01135

(51) Int. Cl.
*H01L 21/30* (2006.01)

(52) U.S. Cl.
USPC ............................. 438/455; 438/459; 438/478

(58) Field of Classification Search
CPC ............... H01L 21/02038; H01L 21/7624; H01L 33/03; H01L 31/0304; H01L 21/18; H01L 21/20

USPC .............. 438/311, 455, 459, 478; 257/347, 257/E27.112, E21.32, E21.545, E21.561
See application file for complete search history.

(56) References Cited

U.S. PATENT DOCUMENTS

| | | | |
|---|---|---|---|
| 6,794,276 B2 | 9/2004 | Letertre et al. | |
| 7,348,260 B2 | 3/2008 | Ghyselen | |
| 2002/0072130 A1* | 6/2002 | Cheng et al. | 438/10 |

(Continued)

FOREIGN PATENT DOCUMENTS

| | | | |
|---|---|---|---|
| EP | 1443550 A | 8/2004 | |
| EP | 1443550 A1 * | 8/2004 | ............ H01L 21/762 |

(Continued)

OTHER PUBLICATIONS

International Search Report for International Application No. PCT/IB2010/00296 mailed Apr. 1, 2010, 3 pages.

(Continued)

*Primary Examiner* — Khiem D Nguyen
(74) *Attorney, Agent, or Firm* — TraskBritt

(57) ABSTRACT

The invention relates to a method of adapting the lattice parameter of a seed layer of a strained material, comprising the following successive steps: a) a structure is provided that has a seed layer of strained material, of lattice parameter $A_1$, of nominal lattice parameter $A_n$ and of thermal expansion coefficient CTE3, a low-viscosity layer and an intermediate substrate of thermal expansion coefficient CTE1; b) a heat treatment is applied so as to relax the seed layer of strained material; and c) the seed layer is transferred onto a support substrate of thermal expansion coefficient CTE5, the intermediate substrate and the support substrate being chosen so that $A_1 < A_n$ and CTE1 ≤ CTE3 and CTE5 > CTE1 or $A_1 > A_n$ and CTE1 ≥ CTE3 and CTE5 < CTE1.

15 Claims, 3 Drawing Sheets

(56) References Cited

U.S. PATENT DOCUMENTS

| | | |
|---|---|---|
| 2006/0266280 A1 | 11/2006 | Francis et al. |
| 2007/0072320 A1 | 3/2007 | Frayssinet et al. |
| 2007/0072324 A1 | 3/2007 | Krames et al. |
| 2008/0149941 A1* | 6/2008 | Li et al. .......................... 257/76 |
| 2008/0303118 A1* | 12/2008 | Arena et al. ................. 257/615 |

FOREIGN PATENT DOCUMENTS

| | | | | |
|---|---|---|---|---|
| FR | 2917232 | * | 12/2008 | .............. H01L 21/20 |
| FR | 2917232 A | | 12/2008 | |
| WO | 2007071772 A | | 6/2007 | |
| WO | WO-2007071772 A1 | * | 6/2007 | .............. H01L 21/20 |

OTHER PUBLICATIONS

International Written Opinion for International Application No. PCT/IB2010/00298 mailed Apr. 1, 2010, 5 pages.

International Preliminary Report on Patentability for International Application No. PCT/IB2010/00296 mailed Sep. 13, 2011, 11 pages.

* cited by examiner

↓ f)

↓ g)

ADAPTATION OF THE LATTICE PARAMETER OF A LAYER OF STRAINED MATERIAL

CROSS-REFERENCE TO RELATED APPLICATIONS

This is a national phase entry under 35 U.S.C. §371 of International Patent Application PCT/IB2010/000296, filed Feb. 15, 2010, published in English as International Patent Publication WO 2010/103356 A1 on Sep. 16, 2010, which claims the benefit under Article 8 of the Patent Cooperation Treaty to French Patent Application Serial No. 0901135, filed Mar. 12, 2009, the entire disclosure of each of which is hereby incorporated herein by this reference.

TECHNICAL FIELD

The present invention relates to a method of adapting the lattice parameter of a seed layer of a strained material. In particular, it enables semiconductor materials to be epitaxially grown for electronic, optoelectronic or photovoltaic applications.

BACKGROUND

When substrates are not available or are very expensive in self-supporting bulk form, they may be obtained as thinner layers by epitaxial growth on seed substrates. However, the properties of these seed substrates are not always perfectly matched to the materials that are desired to grow. For example, the seed substrates may have a thermal expansion coefficient and a lattice parameter that are different from those of materials that are desired to be grown. This may result in the epitaxially grown layer, hereinafter called the "epilayer," being strained, either in compression or in tension. Alternatively, a number of defects, such as dislocations or cracks, may develop during growth of the structure or as it is being cooled, thereby reducing the efficacy of the devices subsequently formed on these layers.

Techniques for relaxing such layers of strained material are known, especially by introducing a low-viscosity layer between the strained layer and a support substrate. By applying a heat treatment at or above the glass transition temperature of the low-viscosity layer, it is then possible to relax the strained layer. However, these techniques do not give completely satisfactory results—the strained layer does not always or completely relax in an elastic mode. The structure formed from a stack of layers having different thermal expansion properties may also deteriorate and the layer to be relaxed may be pulled off the rest of the structure. In addition, when the material is compressively strained, the elastic relaxation may result in the material wrinkling, the roughness and the amplitude between peaks and valleys of the wrinkled layer then not being reconcilable with the desired uses. When the material is tensilely strained, the relaxation often creates cracks and greater surface roughness.

U.S. Patent Publication No. 2007/0072324, now U.S. Pat. No. 8,334,155, issued Dec. 18, 2012, by Krames et al., describes the formation of trenches in an unstrained seed layer in order to form islands or bands of material, followed by lateral epitaxial growth of a material having a different lattice parameter, so as to release the strain in the epitaxially grown layer of material. This document also mentions the possibility of transferring an initially strained seed layer onto a support via a low-viscosity layer and then of applying a heat treatment for at least partial relaxation. The lattice parameter of the seed layer thus approaches its nominal lattice parameter. Subsequent homoepitaxial growth on the seed layer makes it possible to obtain a material that is less strained than the material of the initial seed layer. The document also proposes transferring a seed layer onto a support substrate, the thermal expansion coefficient of which places the seed layer in tension at the epitaxial growth temperature so that its lattice parameter approaches that of the material grown epitaxially at this temperature.

U.S. Pat. Nos. 7,348,260 and 6,794,276 also disclose similar techniques.

However, these documents do not describe how to adapt the lattice parameter of a seed layer of an initially tensilely or compressively strained material to the point of reversing the stress and obtaining a compressively strained or tensilely strained material, respectively, depending on the desired subsequent application, especially for epitaxially growing a material having a low defect density.

SUMMARY OF THE INVENTION

The objective of the invention is to remedy the aforementioned drawbacks of the prior art and, more particularly, to solve the problem of adapting the lattice parameter of a seed layer according to the desired application, especially for epitaxy.

In accordance with the invention, this objective is achieved by the following successive steps:

a) a structure is provided that has:
  a seed layer of strained material, of lattice parameter $A_1$, of nominal lattice parameter $A_n$, and of coefficient of thermal expansion $CTE_1$,
  a low-viscosity layer, and
  an intermediate substrate of coefficient of thermal expansion $CTE_3$;

b) a heat treatment is applied so as to relax the seed layer of strained material; and c) the seed layer is transferred onto a support substrate of coefficient of thermal expansion $CTE_5$, the intermediate substrate and the support substrate being chosen so that:

$A_1 < A_n$ and $CTE_1 \leq CTE_3$ and $CTE_5 > CTE_1$ or $A_1 > A_n$ and $CTE_1 \geq CTE_3$ and $CTE_5 < CTE_1$.

According to one particular embodiment of the invention, the intermediate and support substrates are chosen so that:

$A_1 < A_n$ and $CTE_5 \geq CTE_3$ or $A_1 > A_n$ and $CTE_5 \leq CTE_3$.

According to a development of the invention, step c), wherein the seed layer is transferred, is followed by a step d) comprising the epitaxial growth of one or more layers of material on the seed layer having a lattice parameter $A_3$ at the epitaxial growth temperature of the layer(s).

According to one particular embodiment of the invention, the intermediate and support substrates are chosen according to their respective thermal expansion coefficients $CTE_1$ and $CTE_5$ so that, at the epitaxial growth temperature, the lattice parameter $A_3$ is equal to or larger than $A_n$ when $A_1 < A_n$.

According to another particular embodiment of the invention, the intermediate and support substrates are chosen according to their respective thermal expansion coefficients CTE1 and CTE5 so that, at the epitaxial growth temperature, the lattice parameter $A_3$ is equal to or smaller than $A_n$ when $A_1 > A_n$.

Particularly advantageously, the relaxation of the seed layer in step b) is complete.

According to a preferred embodiment of the invention, the relaxation of the seed layer in step b) is a lateral elastic deformation.

According to a variant of the invention, the seed layer is divided into islands or bands of material.

According to one particular embodiment of the invention, the islands or bands of material are formed by etching or electromagnetic irradiation of the seed layer.

Particularly advantageously, features aligned on the islands or bands of the seed layer are formed in at least one portion of the thickness of the low-viscosity layer.

According to one embodiment of the invention, the low-viscosity layer consists of at least one low-viscosity material, in particular, the material being a borophosphosilicate glass containing between 3% and 7% boron, preferably between 3% and 5% boron.

Advantageously, the relaxation in step b) is carried out in the presence of a stiffener located on the free surface of the seed layer.

According to a development of the invention, the seed layer of strained material is formed according to the following successive steps:
e) deposition of the seed layer of strained material on a nucleating substrate;
f) joining of the seed layer to the intermediate substrate via the low-viscosity layer; and
g) at least partial removal of the nucleating substrate.

Particularly advantageously, the nucleating substrate is partially removed and the stiffener layer is at least partly formed by a residue of the nucleating substrate.

In accordance with the invention, the transfer of the seed layer in step c) comprises:
the bonding of the seed layer to the support substrate via a bonding layer; and
the removal of the intermediate substrate by a mechanical thinning technique, by electromagnetic irradiation, by fracture along a weakened zone, or by chemical etching.

According to one particular aspect of the invention, both the seed layer and the epilayer comprise a III-N (group III-nitride) single-crystal material.

Particularly advantageously, the seed layer is made of a polar material and the epitaxy of step d) is carried out on one face of the III element or elements of the material of the seed layer.

According to another particular embodiment of the invention:
an epilayer grown in step d) and the seed layer are made of InGaN; and
the epilayer has an indium content equal to or greater than that of the seed layer, in particular, a content about 2% greater than that of the seed layer.

According to one particular embodiment of the invention, the intermediate substrate is chosen from silicon, SiC, p-SiC and quartz, and the support substrate is made of sapphire.

According to a development of the invention, the epilayer or epilayers are one or more active layers, in particular, one or more active layers for laser components, for photovoltaic components or for light-emitting diodes.

BRIEF DESCRIPTION OF THE DRAWINGS

Other features, aims and advantages of the invention will become apparent from the following detailed description, with reference to the appended figures in which.

DETAILED DESCRIPTION OF THE INVENTION

Figure 1:
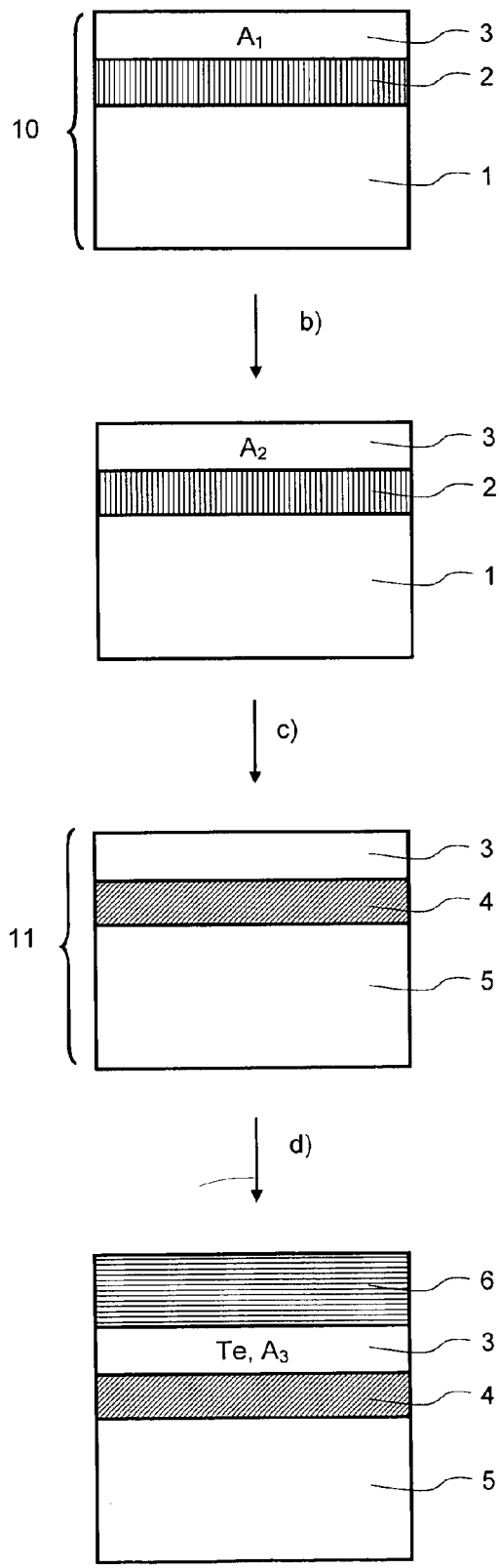
FIG. 1 illustrates the steps of relaxing a seed layer and of reversing the strain therein, followed by an epitaxial growth step according to one embodiment of the invention.

FIG. 1 shows a structure 10 comprising a seed layer 3 of strained material, a low-viscosity layer 2 and an intermediate substrate 1 of thermal expansion coefficient CTE1. The seed layer 3 has a lattice parameter $A_1$, a nominal lattice parameter $A_n$ and a thermal expansion coefficient CTE3.

A heat treatment as illustrated in step b) of FIG. 1 is applied in order to at least partially relax the seed layer 3. Once the temperature of the structure 10 has returned to room temperature, the lattice parameter of the seed layer 3 is $A_2$, this being closer to A.

According to step c) of FIG. 1, the layer 3 is then transferred onto a support substrate 5 of thermal expansion coefficient CTE5, the intermediate substrate 1 and the support substrate 5 being chosen so that the following inequalities are satisfied:

$$A_1 < A_n \text{ and } CTE1 \leq CTE3 \text{ and } CTE5 > CTE1$$

or $$A_1 > A_n \text{ and } CTE1 \geq CTE3 \text{ and } CTE5 < CTE1.$$

Each thermal expansion coefficient mentioned represents an average over the entire relevant temperature range during the method of the invention. The relationships between the coefficients are valid throughout the method.

It will be recalled that a material is said to be strained, in tension or in compression respectively in the interfacial plane with the material on which it rests, when its lattice parameter is larger or smaller than its nominal lattice parameter $A_n$ in the same plane, i.e., its lattice parameter in the natural state. Particularly advantageously, the invention may apply to initially tensilely strained layers—in this case $A_1$ is larger than $A_n$,—as well as to initially compressively strained layers, i.e., $A_1$ is smaller than $A_n$.

It should also be pointed out that the term "layer" must be understood in the broad sense of the term, that is to say, the layer may be continuous or discontinuous.

The term "low-viscosity layer" is understood to mean a layer of amorphous material that flows and becomes viscous when it is raised to a temperature above its glass transition temperature. Preferably, a low-viscosity layer is used for the invention, i.e., one in which the glass transition temperature is quite low. For example, the glass transition temperature of a high-viscosity oxide is of the order of 1000° C., or even above 1200° C., while the glass transition temperature of a low-viscosity oxide lies between 600° C. and 1000° C.

The amorphous material of the low-viscosity layer 2, according to the invention, may be a glass, such as a lithium-based glass, or an oxide, such as $SiO_2$, doped with boron or with boron and phosphorus in order to form a borosilicate glass (BSG) or a borophosphosilicate glass (BPSG). The proportion of boron determines the glass transition temperature of the oxide—it is thus possible to fix the composition of the oxide in order to make it viscous at the desired temperature. For example, the glass transition temperature of a BPSG layer containing 4.5% boron is about 650° C.

According to one particular embodiment of the invention, the transfer of the seed layer 3 onto the support substrate 5 may include beforehand the depositing of a bonding layer 4 on the layer 3 and/or on the support substrate 5. The layer 3 and the substrate 5 are then brought into contact via the bonding layer 4 and then the intermediate substrate 1 is removed by a known technique, such as mechanical thinning, chemical etching, electromagnetic irradiation or fracture along a weakened zone, for example, by the implantation of ionic species according to the SMARTCUT® technology. The bonding layer 4 is preferably chosen to be made of a material that does not flow at the temperatures reached during use of a structure 11 thus formed. In the case of an epitaxial growth, the layer 4 typically comprises silicon oxide $SiO_2$.

Advantageously, the invention proposes to choose the materials of the intermediate substrate 1 and support substrate 5 in such a way that the coefficients CTE1 and CTE5 judiciously influence the variation of the initial lattice parameter $A_1$ of the seed layer 3 depending on the desired subsequent use.

It is known that the thermal expansion of a structure such as the structure 10, which includes a layer with a thickness of less than 100 microns bonded to a substrate of greater thickness, is governed by the thermal expansion coefficient of the substrate. Therefore, the lattice parameter of the seed layer 3 bonded to a substrate 1 or 5 may be adapted without degrading the material as a function of the temperature and the thermal expansion coefficient of the substrate.

Figure 2:
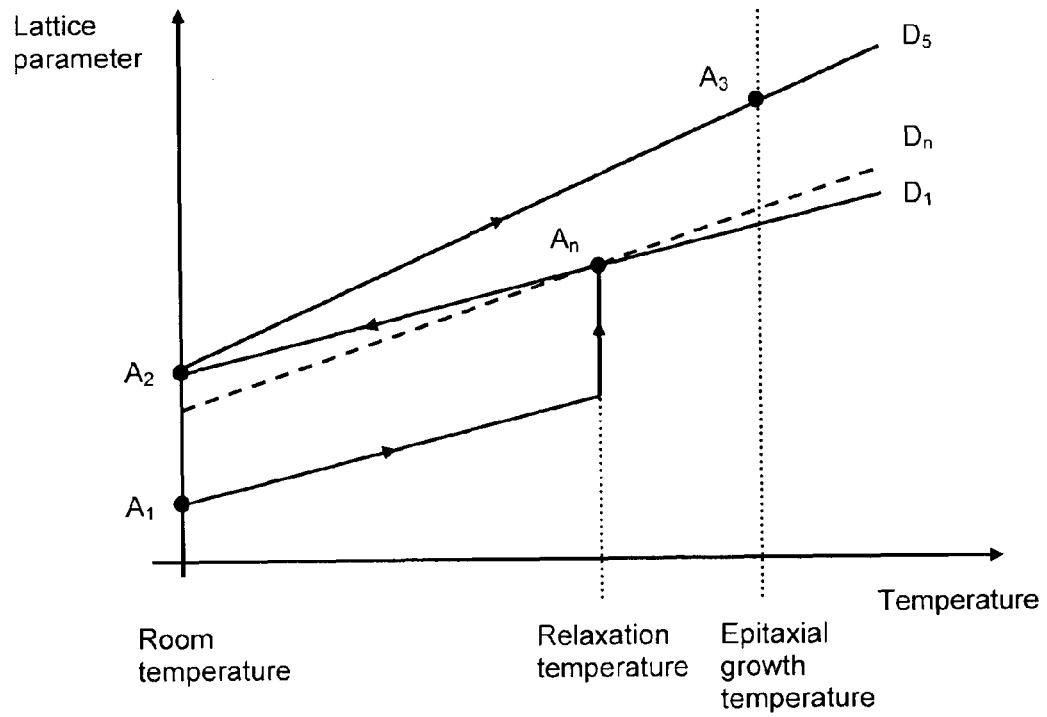
FIG. 2 illustrates the variation with temperature of the lattice parameter of a seed layer when $A_1 < A_n$ according to one embodiment of the invention.

An example of the variation of the lattice parameter of the seed layer 3 in the various steps of the method according to the invention is shown in FIG. 2. The lines $D_1$, $D_n$ and $D_5$ represent the variation as a function of temperature of the lattice parameter of a relaxed material of thermal expansion coefficients CTE1, CTE3 and CTE5, respectively.

At room temperature, the lattice parameter $A_1$ of the seed layer 3 is smaller than its nominal lattice parameter $A_n$—the material is in compression. During application of the heat treatment of step b), the lattice parameter varies according to the expansion of the intermediate substrate 1 to which the seed layer 3 is bonded. The variation of the parameter is shown with the same slope as that of the line $D_1$.

When the temperature of the heat treatment is high enough for relaxation of the seed layer 3, the lattice parameter of the layer 3 at least partly relaxes and may reach its nominal lattice parameter $A_n$, as indicated in FIG. 2. At this temperature, the layer 3 is separated from the substrate 1 and no longer feels the effect of its thermal expansion.

As the structure 10 cools down, when the temperature falls below the flow temperature of the layer 2, the seed layer 3 is again joined to the intermediate substrate 1. The lattice parameter of the layer 3 feels the influence of the contraction of the intermediate substrate 1 according to its thermal expansion coefficient CTE1. Its variation as a function of temperature is shown by the line $D_1$. Because the coefficient CTE1 is lower than the coefficient CTE3, the slope of the line $D_n$ is greater than that of the line $D_1$. Thus, the lattice parameter of the layer 3 reaches the value $A_2$, this being larger than the nominal lattice parameter $A_n$ at room temperature.

The layer 3 is then transferred, in step c) shown in FIG. 1, onto a support substrate 5 in order to form the structure 11. The coefficient CTE5 of the substrate 5 is strictly greater than the coefficient CTE1.

Application of a heat treatment to the structure 11 then results in a variation of the lattice parameter of the seed layer 3 according to the line $D_5$, illustrating the expansion of the material according to the coefficient CTE5. Since the slope of $D_5$ is greater than that of $D_1$, the lattice parameter of the seed layer 3 may then be larger than $A_1$, irrespective of the temperature applied to the structure 11.

When the relationship CTE5≥CTE3 is satisfied, the lattice parameter of the seed layer 3 may then be larger than the nominal lattice parameter $A_n$ irrespective of the temperature applied to the structure 11.

Thus, the choice of coefficients CTE1 and CTE5 of the intermediate substrate 1 and support substrate 5, respectively, makes it possible to adapt the lattice parameter of a seed layer 3 so that the initially compressively strained material may be put into tension.

Figure 3:
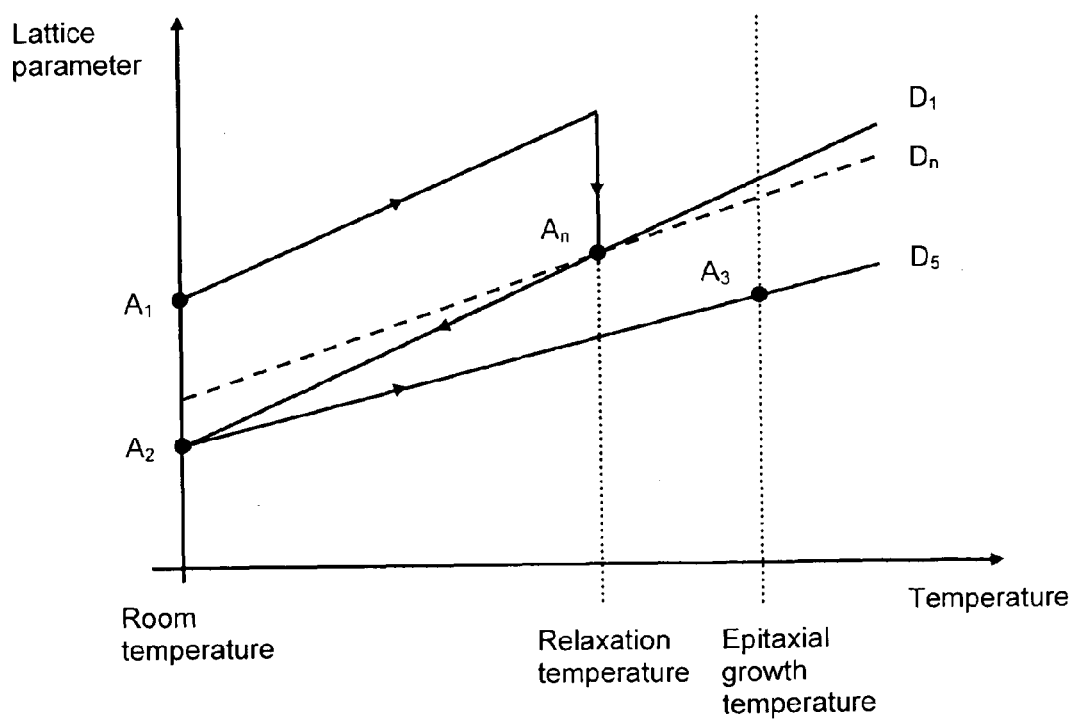
FIG. 3 illustrates the variation with temperature of the lattice parameter of a seed layer when $A_1 > A_n$ according to one embodiment of the invention.

Conversely, FIG. 3 illustrates an example of the method according to the invention when the lattice parameter $A_1$ is initially larger than the parameter $A_n$, i.e., when the seed layer 3 is in tension.

The lattice parameter of the seed layer 3 bonded to the intermediate substrate 1 firstly varies with the slope of the line $D_1$. At the relaxation temperature of the layer 3, the material may at least partially relax and reach its nominal lattice parameter $A_n$. Since the coefficient CTE1 is higher than the coefficient CTE3 of the seed layer 3, on returning to room temperature, the lattice parameter $A_2$ of the layer may be smaller than $A_1$ and $A_n$. The transfer of the seed layer 3 onto a support substrate 5, the coefficient CTE5 of which is strictly lower than the coefficient CTE1, then makes it possible to obtain a lattice parameter of the seed layer 3 smaller than $A_1$ irrespective of the temperature applied.

Advantageously, when the inequality/equality CTE5≤CTE3 is satisfied, the lattice parameter of the seed layer 3 may be smaller than the nominal lattice parameter $A_n$ for any applied temperature. It is thus possible, according to the method of the invention, to reverse the initial strain of the material of the layer 3, i.e., to obtain a compressively strained seed layer 3 from an initially tensilely strained seed layer 3.

Since each thermal expansion coefficient mentioned represents an average, the variation of the associated lattice parameter varies linearly over the temperature range in question, as illustrated in FIG. 2.

According to one particular development of the invention, a layer 6 is then grown epitaxially on the seed layer 3 of the structure 11, as FIG. 1 illustrates, according to step d) of the method of the invention. It is then possible to choose the material of the intermediate substrate 1 and the material of the support substrate 5 according to their expansion coefficients CTE1 and CTE5 so that, by applying the method of the invention, the lattice parameter $A_3$ of the layer 3 obtained at the epitaxial growth temperature $T_e$ is matched to the lattice parameter of the epilayer 6.

Therefore, a material that is not easily available in bulk form, and/or for which no seed substrate with a similar lattice parameter exists, can be grown homoepitaxially on a seed layer 3 of this same material, obtained initially in strained form. The crystalline quality of the epilayer 6, such as the density and size of the defects, is, therefore, optimized.

A material of a layer 6 may also be grown heteroepitaxially on the layer 3, the initial strain of which was reversed in order to obtain a lattice parameter similar to that of the layer 6. For example, a seed layer 3 of GaN initially in compression is transferred onto a silicon substrate, the thermal expansion coefficient of which is lower than that of GaN in order to prepare the structure 10. The relaxation heat treatment results in the GaN layer 3 being put into tension. The transfer of the seed layer 3 onto a sapphire support substrate 5, having a thermal expansion coefficient higher than that of GaN, makes it possible to increase the tension in the seed layer 3 and reach the lattice parameter $A_3$, which is similar to that of the InGaN layer 6 at its epitaxial growth temperature $T_e$.

For an optimum effect on the lattice parameter of the seed layer 3, the relaxation heat treatment is applied so as to completely relax the strain in the layer 3. Preferably, the heat treatment is obtained by heating the entire structure 10 in a heater so that all of the layers constituting the structure 10 are evenly heated. However, it would also be conceivable to apply a local heat treatment on the low-viscosity layer 2.

Preferably, the relaxation is carried out under conditions that allow mainly lateral elastic deformation. The surface of the layer 3 thus remains planar, enabling it to be well bonded to the support substrate 5.

These conditions may include the use of a stiffener layer 13 on the surface of the layer 3. The material of the stiffener layer 13 must then have thermomechanical properties and a thickness that are suitable for ensuring sufficient rigidity at the temperatures in question. Depending on the strain and the lattice parameter of the material of the stiffener 13, the latter may partially impede the relaxation of the layer 3. The stiffener 13 may then be removed after the heat treatment resulting in partial relaxation, in order to carry out a complementary relaxation heat treatment. In all cases, the stiffener 13 is removed for the purpose of transferring the layer 3 onto the support substrate 5 in step c) of the method.

Figure 4:
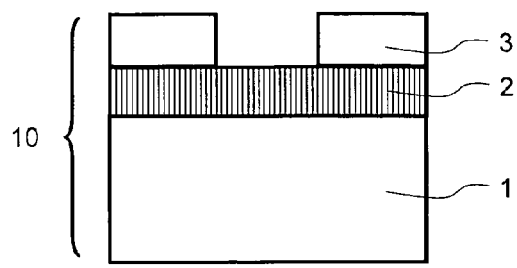
FIGS. 4 and 5 illustrate a structure according to particular embodiments of the invention, wherein the seed layer is in the form of islands or bands of material.

According to another aspect of the invention, the seed layer 3 may be cut into islands of material, as shown in FIG. 4. These islands make it possible to limit the relaxation, by wrinkling or by crack formation, while still promoting lateral relaxation. These islands may be of any shape and any size. They may be islands of material in the form of strips or elongate parallelepipeds. Square-shaped islands are preferred for practical reasons relating to their fabrication—their dimensions may vary, depending on the initial strain of the material, from 100 microns×100 microns to 3 mm×3 mm, for example. They may be formed by electromagnetic irradiation using a radiation source, the wavelength of which corresponds to the absorbent properties of the material. For example, a laser is used to form islands in a nitride material of III-N type, more particularly, a laser having a wavelength of less than 400 nm is used to etch trenches in order to form GaN islands. These islands may also be formed by masking and etching, as is well known to those skilled in the art.

Figure 5:
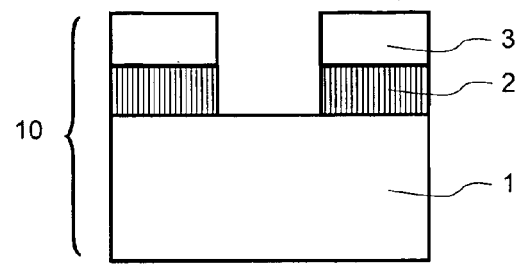

According to one variant of the invention, features aligned on the islands of the seed layer 3 are formed in at least one portion of the thickness of the low-viscosity layer 2, so as to facilitate relaxation of the strained material. Depending on the case, the features are produced right through the thickness of the low-viscosity layer 2 so as to obtain separate islands, as illustrated in FIG. 5. Preferably, the islands formed from the layer 2 are of the same size as the islands of the seed layer 3.

According to one embodiment of the invention, the stiffener layer 13 is also cut in the form of islands on the islands of the layer 3 so as to optimize the relaxation.

Figure 6:
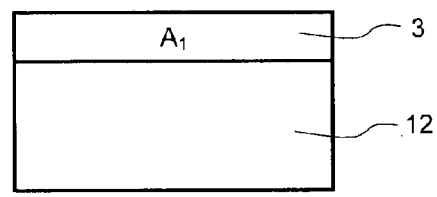
FIG. 6 illustrates steps for fabricating the seed layer and for relaxing the seed layer in the presence of a stiffener according to one embodiment of the invention.
Figure 6:
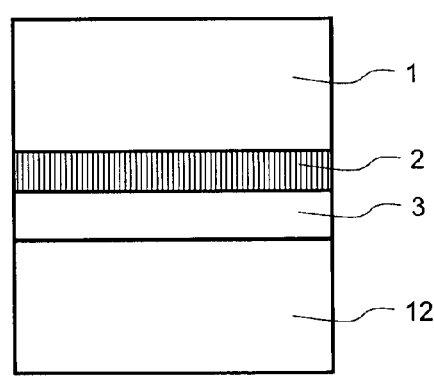
Figure 6:
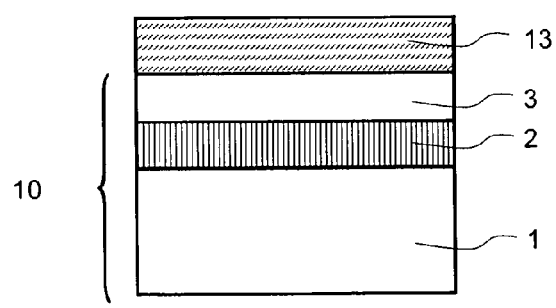

The invention also relates to a method of fabricating the structure 10. As illustrated in FIG. 6, the seed layer 3 is deposited, for example, by epitaxy, on a bulk nucleating substrate 12 or one composed of a layer on a support (not shown). The lattice parameter of the material of the layer 3 differs from that of the material of the substrate 12 on which it is grown epitaxially. The epitaxy may be carried out using a known method, such as MOCVD (metalorganic vapor phase epitaxy) or MBE (molecular beam epitaxy), and the layer 3 of strained single-crystal or polycrystalline material is then obtained. The thickness of this layer 3 is preferably limited so as to prevent the cumulative strain from resulting in any plastic deformation impairing the crystallographic quality of the material. The thickness may vary, depending on the nature of the materials involved, between 50 nm and 2 microns without creating defects of the dislocation or crack type during growth.

Referring to step f) of the method illustrated in FIG. 6, the intermediate substrate 1 is joined to the layer 3, for example, by direct wafer bonding (also called molecular adhesion), via a low-viscosity layer 2 formed beforehand. This layer 2 typically has a thickness ranging from 0.1 micron to 5 microns.

In step g) illustrated in FIG. 6, the nucleating substrate 12 is at least partially removed from the layer 3, for example, by mechanical or chemical thinning or by electromagnetic irradiation at the interface with the layer 3. When the substrate 12 has been completely removed, a stiffener layer 13 may be deposited directly on the exposed face of the layer 3 to the desired thickness. When the nucleating substrate 12 is partially removed, the residue of the nucleating substrate 12 may then form at least part of the stiffener layer 13.

According to a particular aspect of the invention, the seed layer 3 is made of a III-N and preferably single-crystal material, comprising binary, ternary and quaternary alloys of III elements and nitrogen. When the layer 3 of III-N material is formed on the nucleating substrate 12, it preferably has an exposed face of III polarity. The double transfer of the seed layer 3 from the nucleating substrate 12 onto the intermediate substrate 1 and then onto the support substrate 5, according to the invention, advantageously makes it possible to obtain an exposed face of III polarity, which is known to be more favorable than the N face for the epitaxy of a layer 6 of III-N polar materials.

Preferably, the III-N material is single-crystal InGaN with an indium content of between 3% and 35%. More preferably, the InGaN has an indium content of between 5% and 10%.

In accordance with this particular embodiment of the invention, the material of the low-viscosity layer 2 is chosen so that the relaxation heat treatment can be carried out between 750° C. and 1050° C. and preferably between 850° C. and 950° C. The low-viscosity layer 2 is, for example, made of a borophosphosilicate glass, the boron oxide content of which is preferably between 3% and 7% and even more preferably between 3% and 5%.

The intermediate substrate 1 is preferably chosen from silicon, SiC, p-SiC, InP, InAs and quartz, these materials having a thermal expansion coefficient CTE1 lower than the coefficient CTE3 of III-N materials, which is around $5.6 \times 10^{-6}.K^{-1}$. The support substrate 5 is, for example, made of sapphire, GaAs, or germanium, the expansion coefficient CTE5 of which is higher than the coefficient CTE3. This allows the seed layer 3 to reach a lattice parameter $A_3$ larger than its nominal parameter $A_n$ at the temperature $T_e$ for the epitaxy of a relaxed layer 6.

According to one particular embodiment of the invention, the material of the seed layer 3 and that of the epilayer 6 is single-crystal InGaN. Preferably, the indium content of the layer 6 is greater than that of the seed layer 3, the straining of the layer 3, according to the method of the invention, enabling a lattice parameter $A_3$ similar to that of the layer 6 at the epitaxial growth temperature $T_e$ to be achieved.

For example, a layer 3 of InGaN with an indium content between 3% and 5% can make it possible to grow a relaxed InGaN layer 6 at the epitaxial growth temperature comprising an indium range having more than 2% by comparison with the seed layer 3. Since the layer 6 is relaxed, its thickness is not critical—it may be between 100 nm and 2 microns. This layer 6 then has the crystallographic properties necessary for being able to be used as one or more active layers for laser or photovoltaic components or for light-emitting diodes.

As an example, one embodiment according to the invention will now be described. Referring to FIG. 6, a layer 3 of indium gallium nitride (InGaN) containing 6% indium and having a thickness of 100 nm is deposited epitaxially on a sapphire nucleating substrate 12 of a gallium nitride GaN buffer layer of 3 microns thick.

A low-viscosity layer 2, made of a borophosphosilicate glass with a boron content of 4.5%, is then deposited on the InGaN layer 3 with a thickness of about 500 nm.

A borophosphosilicate glass layer 2 is deposited on the silicon intermediate substrate 1 with a thickness of 1 micron and then the exposed surfaces of the borophosphosilicate glass layers deposited on the support 1 and on the InGaN layer 3 are polished (not shown in the figures), for example, by a CMP (chemical-mechanical polishing) technique before they are brought into intimate contact with each other. The borophosphosilicate glass low-viscosity layer 2 thus formed has a thickness of about 1 micron because 500 nm of material is removed during the polishing.

The support substrate 5 is then removed, for example, by electromagnetic irradiation at the interface between the substrate 5 and the GaN buffer layer. The residue of the gallium nitride layer on the layer 3 has a thickness of about 150 nm, which will serve as stiffener layer 13 on the layer 3, as illustrated in FIG. 6.

Referring to step g) in FIG. 6, the InGaN layer 3 transferred onto the intermediate substrate 1 via the low-viscosity layer 2, covered with the stiffener layer 13, is obtained.

Optionally, the residue 13, the strained InGaN layer 3 and the low-viscosity layer 2 are etched by a standard lithography/etching process so as to obtain square islands comprising stiffener layers 13, layers 3 of strained material and low-viscosity layers 2 with dimensions of 1 mm×1 mm, respectively.

A heat treatment according to step b), illustrated in FIG. 1, is applied to the structure 10 in order to heat the low-viscosity layer 2 to a temperature above its glass transition temperature, for example, a heat treatment at 850° C. for 4 hours, so as to obtain complete lateral relaxation, i.e., without wrinkling or any other deterioration of the crystalline quality of the material of the InGaN layer 3.

When the temperature returns to room temperature, the silicon intermediate substrate 1 expands the InGaN layer 3, which reaches a lattice parameter $A_2$ larger than the nominal parameter $A_n$.

The stiffener layer 13 is removed to expose the face of N polarity of the layer 3 owing to its transfer onto the substrate 1. A complementary relaxation heat treatment may be carried out in order to completely relax the layer 3. This layer is then bonded to a sapphire support substrate 5 via an $SiO_2$ bonding layer 4, and the substrate 1 is removed in order to form the structure 11 as shown in step c) of FIG. 1. The InGaN layer 3 transferred onto the substrate 5 then has an exposed face of gallium polarity.

The structure 11 is then heated to a temperature $T_e$ of 900° C. for the purpose of epitaxially growing an InGaN layer 6 having an indium content of 10%. This heat treatment results in the sapphire substrate 5 expanding, thereby imposing a similar expansion on the seed layer 3. The lattice parameter $A_3$ of the layer 3, estimated to be 0.32349 nm according to the CTE1 and CTE5 values, is compatible with the lattice parameter of InGaN containing 10% indium. A strain-free 10%-indium InGaN layer 6 is then formed at the temperature $T_e$ on the seed layer 3. The layer 6 may be used as an active layer for photovoltaic or laser components or for light-emitting diodes.

The invention claimed is:

1. A method of adapting a lattice parameter of a seed layer of a strained material, comprising:
   providing a structure including:
      a seed layer of strained material having a lattice parameter $A_1$, a nominal lattice parameter $A_n$, and a thermal expansion coefficient CTE3;
      a low viscosity layer; and
      an intermediate substrate having a thermal expansion coefficient CTE1;
   applying a heat treatment to relax the seed layer of the strained material;
   transferring the seed layer onto a support substrate having a thermal expansion coefficient CTE5; and
   selecting the intermediate substrate and the support substrate such that:

$A_1 < A_n$ and CTE1 ≤ CTE3 and CTE5 > CTE1 or $A_1 > A_n$ and CTE1 ≥ CTE3 and CTE5 < CTE1; and epitaxially growing at least one epilayer having a lattice parameter $A_3$ on the seed layer after the transferring of the seed layer onto the support substrate.

2. The method of claim 1, further comprising selecting the intermediate substrate and the support substrate such that:

$A_1 < A_n$ and CTE5 ≤ CTE3.

3. The method of claim 1, further comprising selecting the intermediate substrate and the support substrate such that:

$A_1 > A_n$ and CTE5 ≤ CTE3.

4. The method of claim 1, further comprising selecting the intermediate substrate and the support substrate such that the lattice parameter $A_3$ is equal to or larger than $A_n$ at an epitaxial growth temperature at which the at least one epilayer is epitaxially grown on the seed layer, when A1 < An.

5. The method of claim 1, further comprising selecting the intermediate substrate and the support substrate such that the lattice parameter $A_3$ is equal to or less than $A_n$ at an epitaxial growth temperature at which the at least one epilayer is epitaxially grown on the seed layer, when A1 > An.

6. The method of claim 1, further comprising forming each of the seed layer and the at least one epilayer to comprise III-N single crystal material.

7. The method of claim 1, further comprising:
   forming each of the at least one epilayer and the seed layer to comprise InGaN; and
   forming the at least one epilayer to have an indium content greater than an indium content of the seed layer.

8. The method of claim 7, wherein forming the at least one epilayer to have an indium content greater than an indium content of the seed layer comprises forming the at least one epilayer to have an indium content at least about 2% greater than an indium content of the seed layer.

9. The method of claim 6, further comprising:
   selecting the intermediate substrate from the group consisting of silicon, SiC, p-SiC, and quartz; and
   selecting the support substrate to comprise sapphire.

10. The method of claim 1, further comprising forming the at least one epilayer to comprise one or more active layers for at least one of a laser component, a photovoltaic component, and a light-emitting diode.

11. The method of claim 1, wherein applying the heat treatment to relax the seed layer of the strained material comprises completely relaxing the seed layer of the strained material.

12. The method of claim 1, further comprising dividing the seed layer into islands or bands of material.

13. The method of claim 12, further comprising forming features in at least one portion of the low viscosity layer aligned on the islands or bands of material.

14. The method of claim 1, further comprising providing a stiffener layer on a free surface of the seed layer during the heat treatment to relax the seed layer of the strained material.

15. The method of claim 1, wherein transferring the seed layer onto the support substrate comprises:
- bonding the seed layer to the support substrate using a bonding layer; and
- removing the intermediate substrate by one of a thinning technique, electromagnetic radiation, fracture along a weakened zone, and chemical etching.

* * * * *

UNITED STATES PATENT AND TRADEMARK OFFICE
CERTIFICATE OF CORRECTION

| | |
|---|---|
| PATENT NO. | : 8,785,293 B2 |
| APPLICATION NO. | : 13/147749 |
| DATED | : July 22, 2014 |
| INVENTOR(S) | : Pascal Guenard and Frederic Dupont |

It is certified that error appears in the above-identified patent and that said Letters Patent is hereby corrected as shown below:

In the specification:
COLUMN 2,   LINE 31,   change "parameter $A_{,,}$" to --parameter $A_n$--

In the claims:
CLAIM 2,   COLUMN 10,   LINE 35,   change "$A_l < A_n$ and CTE5 ≤ CTE3." to
--$A_l < A_n$ CTE5 ≥ CTE3.--

Signed and Sealed this
Fifteenth Day of December, 2015

Michelle K. Lee
*Director of the United States Patent and Trademark Office*